(12) United States Patent
Li

(10) Patent No.: US 9,282,674 B2
(45) Date of Patent: Mar. 8, 2016

(54) SERVER AND CARRING STRUCTURE THEREOF

(71) Applicants: Inventec (Pudong) Technology Corporation, Shanghai (CN); INVENTEC CORPORATION, Taipei (TW)

(72) Inventor: Ming-Gang Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 335 days.

(21) Appl. No.: 14/029,523

(22) Filed: Sep. 17, 2013

(65) Prior Publication Data

US 2015/0029654 A1    Jan. 29, 2015

(30) Foreign Application Priority Data

Jul. 29, 2013  (CN) .......................... 2013 1 0322149

(51) Int. Cl.
*H05K 7/14*  (2006.01)
(52) U.S. Cl.
CPC ............ *H05K 7/1489* (2013.01); *H05K 7/1487* (2013.01)
(58) Field of Classification Search
CPC ..... H05K 7/14; H05K 7/1489; H05K 7/1487; H05K 7/1485; H05K 7/1417
USPC ...................... 361/679.37, 685, 726
See application file for complete search history.

(56) References Cited

U.S. PATENT DOCUMENTS

| | | | | |
|---|---|---|---|---|
| 5,299,089 A | * | 3/1994 | Lwee ....................... | G06F 1/184 361/679.33 |
| 7,019,965 B2 | * | 3/2006 | Bradley .................. | G06F 1/184 361/679.38 |
| 2014/0254086 A1 | * | 9/2014 | Li ..................... | H01R 13/62944 361/679.32 |

* cited by examiner

*Primary Examiner* — Dion R Ferguson
*Assistant Examiner* — Mandeep S Buttar
(74) *Attorney, Agent, or Firm* — Locke Lord LLP; Tim Tingkang Xia, Esq.

(57) ABSTRACT

A server includes a motherboard module, a storage device and a carrying structure. The motherboard module includes a motherboard and a CPU disposed on the motherboard. The storage device has two fastening portions opposite to each other. The carrying structure includes a carrier, two fastening members and a handle. The storage device is disposed on the carrier in a detachable manner. The two fastening members each include a fastening section and a pushing section connected to each other. Each of the two fastening sections is disposed on the carrier in a slidable way. The storage device is located between the two fastening sections. The handle includes two pushing sides corresponding to the two pushing sections. The handle is pivotally disposed on the carrier. The two pushing sides are located between the two pushing sections. The handle is capable of pivoting relative to the carrier.

15 Claims, 4 Drawing Sheets

SERVER AND CARRING STRUCTURE THEREOF

CROSS-REFERENCE TO RELATED APPLICATIONS

This non-provisional application claims priority under 35 U.S.C. §119(a) on Patent Application No(s). 201310322149.7 filed in China, P.R.C. on Jul. 29, 2013, the entire contents of which are hereby incorporated by reference.

BACKGROUND OF THE INVENTION

1. Technical Field of the Invention

The disclosure relates to a server, more particularly to a sever with an assembly structure for a hard disk drive.

2. Description of the Related Art

As electronic science and technology develops, servers have been widely used in the information processing systems. A server usually includes a motherboard, a power supply, one or more hard disk drives, etc. Nowadays, data for the server to process rises incessantly, so that the number of the hard disk drives in the server increases accordingly.

The hard disk drive is a crucial storage device for the server. The hard disk drive is a data storage device used for storing and retrieving digital information using rapidly rotating disks coated with magnetic material. Through a magnetic head near the magnetic surface, digital information can be written into the hard disk drive by the electromagnetic flow after the electromagnetic flow changes magnetic. In addition, the same digital information can be read via the opposite way.

The hard disk drive is usually disposed to the server via a carrying structure. Nonetheless, currently it is not easy to assemble the hard disk drive to the carrying structure or to disassemble the hard disk drive from the carrying structure. Specifically, it requires many locking elements to assemble the hard disk drive to the carrying structure. When disassembling the hard disk drive from the carrying structure, it is needed to remove locking elements first. The process of the assembly and disassembly mentioned above is complicated and inconvenient for the users. Hence, to design a carrying structure capable of rapid assembly and disassembly regarding the hard disk drive is an important task for the designers in the related industries.

SUMMARY OF THE INVENTION

A server comprises a motherboard module, a storage device and a carrying structure. The motherboard module comprises a motherboard and a CPU disposed on the motherboard. The storage device has two fastening portions opposite to each other. The carrying structure comprises a carrier, two fastening members and a handle. The storage device is disposed on the carrier in a detachable manner. The two fastening members each comprise a fastening section and a pushing section connected to each other. Each of the two fastening sections is disposed on the carrier in a slidable way. The storage device is located between the two fastening sections. The handle comprises two pushing sides corresponding to the two pushing sections. The handle is pivotally disposed on the carrier. The two pushing sides are located between the two pushing sections. The handle is configured for pivoting relative to the carrier. When the handle pivots from a second position to a first position, the two pushing sides pushes the two pushing sections respective and drive the two fastening sections to be away from the two fastening portions of the storage device. When the handle pivots for the first position to the second position, the two fastening sections close up to each other and are fastened with the two fastening portions of the storage device.

Moreover, a carrying structure for carrying a storage device is disclosed. The carrying structure comprises a carrier, two fastening members and a handle. The storage device is disposed on the carrier in a detachable manner. The two fastening members each comprise a fastening section and a pushing section connected to each other. Each of the two fastening sections is disposed on the carrier in a slidable way. The storage device is located between the two fastening sections. The handle comprises two pushing sides corresponding to the two pushing sections. The handle is pivotally disposed on the carrier. The two pushing sides are located between the two pushing sections. The handle is configured for pivoting relative to the carrier. When the handle pivots from a second position to a first position, the two pushing sides pushes the two pushing sections respective and drive the two fastening sections to be away from the two fastening portions of the storage device. When the handle pivots for the first position to the second position, the two fastening sections close up to each other and are fastened with the two fastening portions of the storage device.

BRIEF DESCRIPTION OF THE DRAWINGS

The present disclosure will become more fully understood from the detailed description given herein below for illustration only, and thus does not limit the present disclosure, wherein.

DETAILED DESCRIPTION

Figure 1:
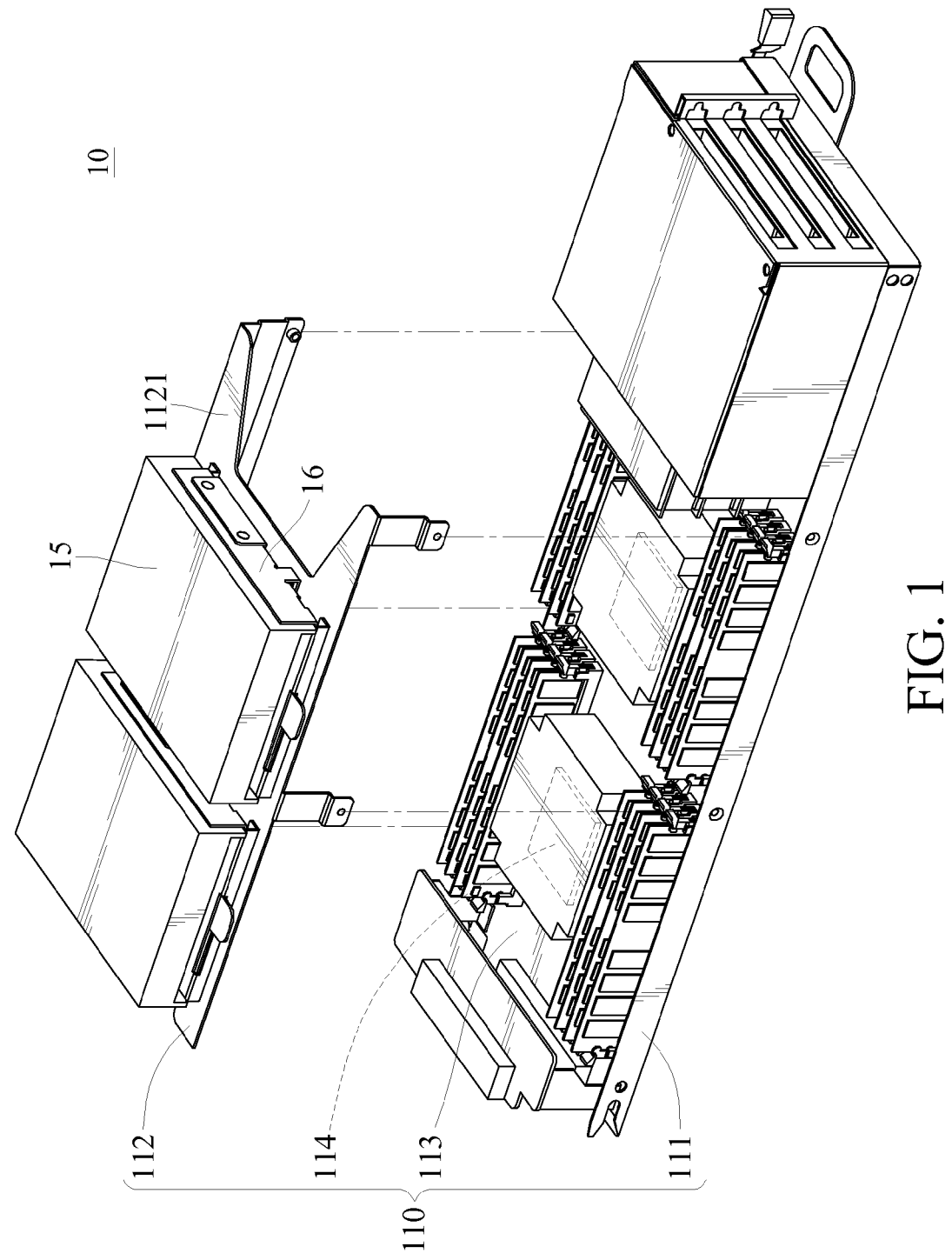
FIG. 1 is a perspective view of a server according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
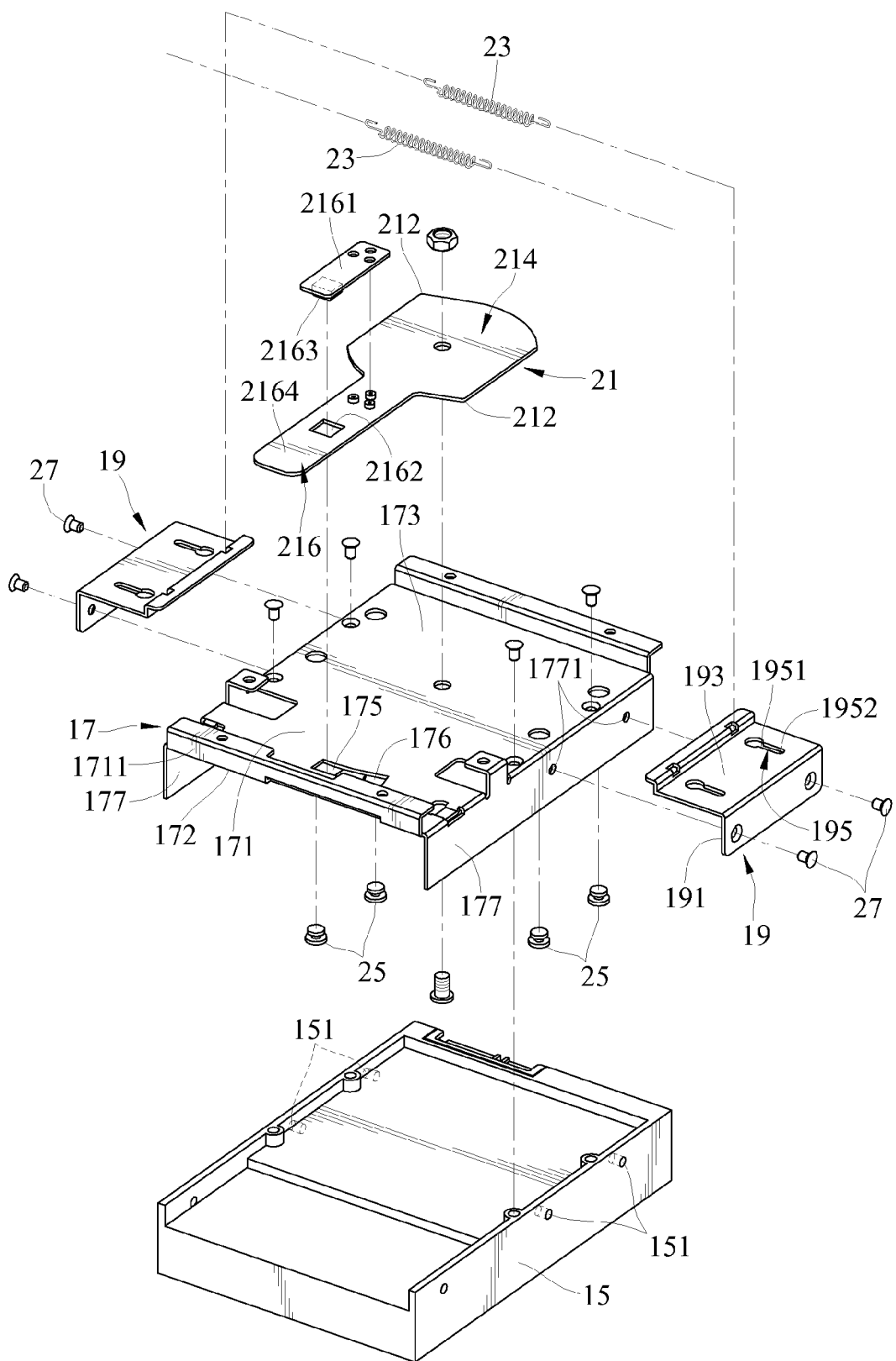
FIG. 2 is an exploded view of a carrying structure and a storage device according to an embodiment of the disclosure.
Figure 3:
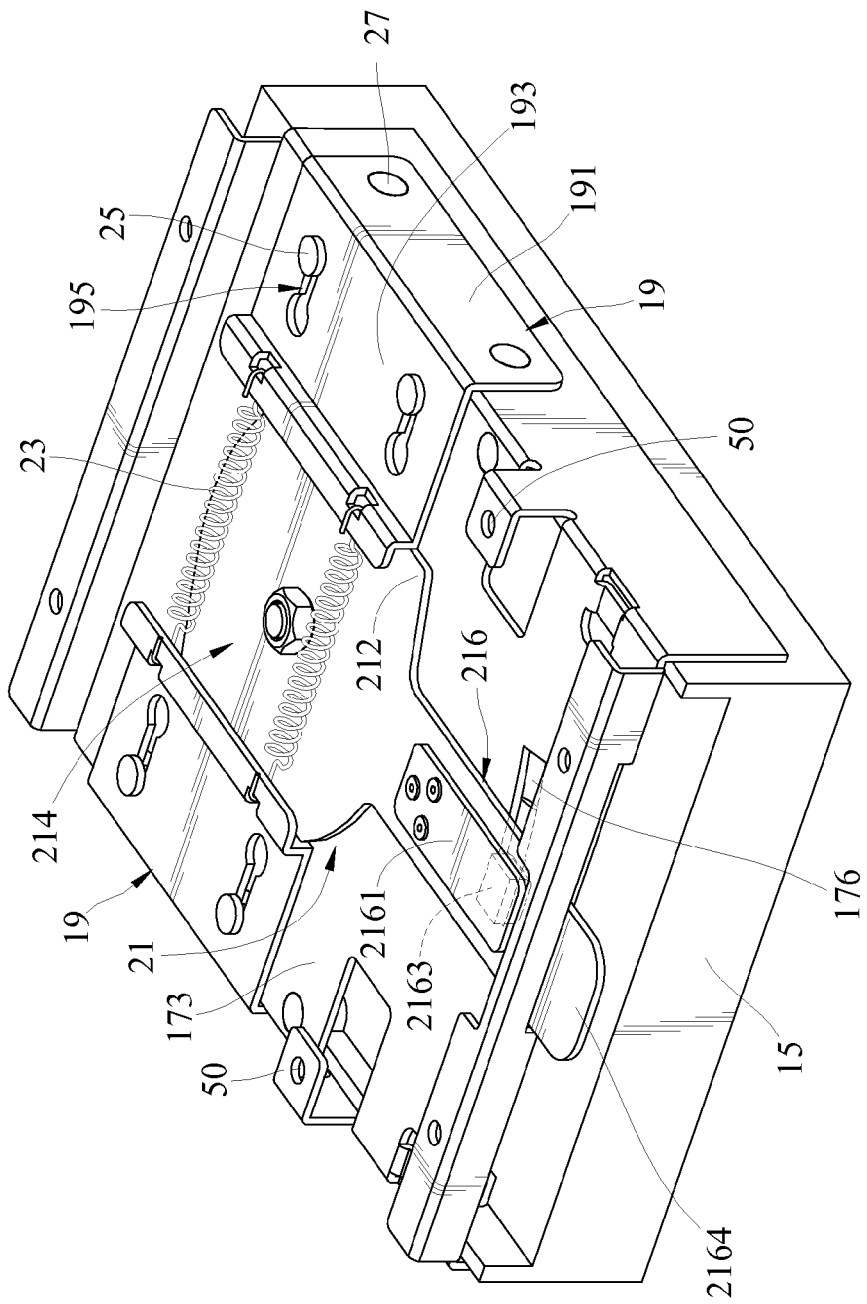
FIG. 3 is a perspective view of a carrying structure and a storage device according to an embodiment of the disclosure.

Referring to FIG. 1 to FIG. 3, FIG. 1 is a perspective view of a server according to an embodiment of the disclosure; FIG. 2 is an exploded view of a carrying structure and a storage device according to an embodiment of the disclosure; and FIG. 3 is a perspective view of a carrying structure and a storage device according to an embodiment of the disclosure.

A server 10 comprises a motherboard module 110, a storage device 15 and a carrying structure 16.

The motherboard module 110 comprises a motherboard 113, a central processing unit 114 (hereinafter CPU 114), a carrying tray 111 and a rack 112. The CPU 114 is disposed on the motherboard 113. The rack 112 is fixed to the carrying tray 111. The rack 112 has a platform 1121. The motherboard 113 is disposed on the carrying tray 111 and is located between the carrying tray 111 and the platform 1121.

The storage device 15 has four fastening portions 151 in pairs (as shown in FIG. 2). In other embodiments, however, the storage device 15 may only have two fastening portions 151 opposite to each other. In this embodiment, the storage device 15 is a hard disk drive. Furthermore, in this embodiment, the fastening portion 151 is a fastening hole used to engaged with fastening sticks 27 (to be detailed below) of the fastening section 191 (to be detailed below), but this is not intended to limit the disclosure.

The carrying structure 16 comprises a carrier 17, two fastening members 19, a handle 21 and two elastic members 23. In this embodiment, the shape of the handle 21 is similar to a reverse "T". In this embodiment, the elastic member 23 is a spring.

The carrier 17 is installed and fixed to one side, away from the motherboard 113, of the platform 1121. The storage device 15 is detachably disposed on the carrier 17. Specifically, in this embodiment, the carrier 17 comprises a bottom plate 171 and two lateral plates 177. The bottom plate 171 has a carrying surface 172 and a bottom surface 173 opposite to each other, a first locating hole 176, a second locating hole 175, a first edge 1711 and two protruding sticks 25. The storage device 15 is detachably disposed on the carrying surface 172. The two lateral plates 177 are disposed on the opposite sides of the bottom plate 171 respectively, and the first edge 1711 connects the two lateral plates 177. In this embodiment, each of the two lateral plates 177 has two through holes 1771, but the disclosure is not limited thereto. In other embodiments, each of the two lateral plates 177 may only have one through hole 1771.

The opposite ends of the elastic member 23 are connected to the two fastening members 19 respectively. The two fastening members 19 each comprise a fastening section 191 and a pushing section 193 connected to each other. The storage device 15 is located between the two fastening sections 191. The two pushing sections 193 are disposed on the bottom surface 173 in a slidable way. The pushing sections 193 can slide on the bottom surface 173. Specifically, the two pushing sections 193 each has two sliding grooves 195. In this embodiment, each of the protruding sticks 25 penetrates the corresponding sliding groove 195, so as to make the two pushing sections 193 be disposed on the bottom surface 173 and to make the two pushing sections 193 be configured for sliding relative to the bottom surface 173. The two fastening sections 191 protrude from the carrying surface 172. Each of the two fastening sections 191 disposes two fastening sticks 27, and the two fastening sticks 27 correspond to the two through holes 1771. Nevertheless, in other embodiments, each of the two fastening sections 191 may only dispose one fastening stick 27.

The handle 21 is pivotally disposed on the carrier 17, and the handle 21 is between the platform 1121 and the carrier 17. The bottom plate 171 is between the storage device 15 and the handle 21. The sliding groove 195 of the pushing section 193 has a first section 1951 near the handle 21 and a second section 1952 away from the handle 21.

The handle 21 comprises two opposite pushing sides 212 corresponding to the two pushing sections 193, a pivoting portion 214 and an extending portion 216. The two pushing sides 212 are between the two pushing sections 193 and the two pushing sides 212 are located on the opposite sides of the pivoting portion 214 respectively. In this embodiment, the distance between one of the two pushing sides 212 and the first edge 1711 is different from the distance between the other of the two pushing sides 212 and the first edge 1711. The extending portion 216 has a hand grip 2164 connected to the pivoting portion 214 and an elastic piece 2161 disposed on the hand grip 2164. In an embodiment, the elastic piece 2161 is installed and fixed to the hand grip 2164 through riveting. The hand grip 2164 is between the elastic piece 2161 and the bottom plate 171. The elastic piece 2161 has a locating block 2163. The hand grip 2164 dispose an accommodating hole 2162 at a place corresponding to the locating block 2163. The end of the hand grip 2164 protrudes beyond the first edge 1711 of the bottom plate 171, and the locating block 2163 protrudes from the accommodating hole 2162. In this embodiment, the locating block 2163 is a protrusion, but it is not limited thereto.

In this and some other embodiments, the carrier 17 may have two locking holes 50. The carrier 17 can be locked onto the platform 1121 by the two locking holes 50 and the appropriate locking members (not shown in the figures), but the disclosure is not limited thereto.

Figure 5:
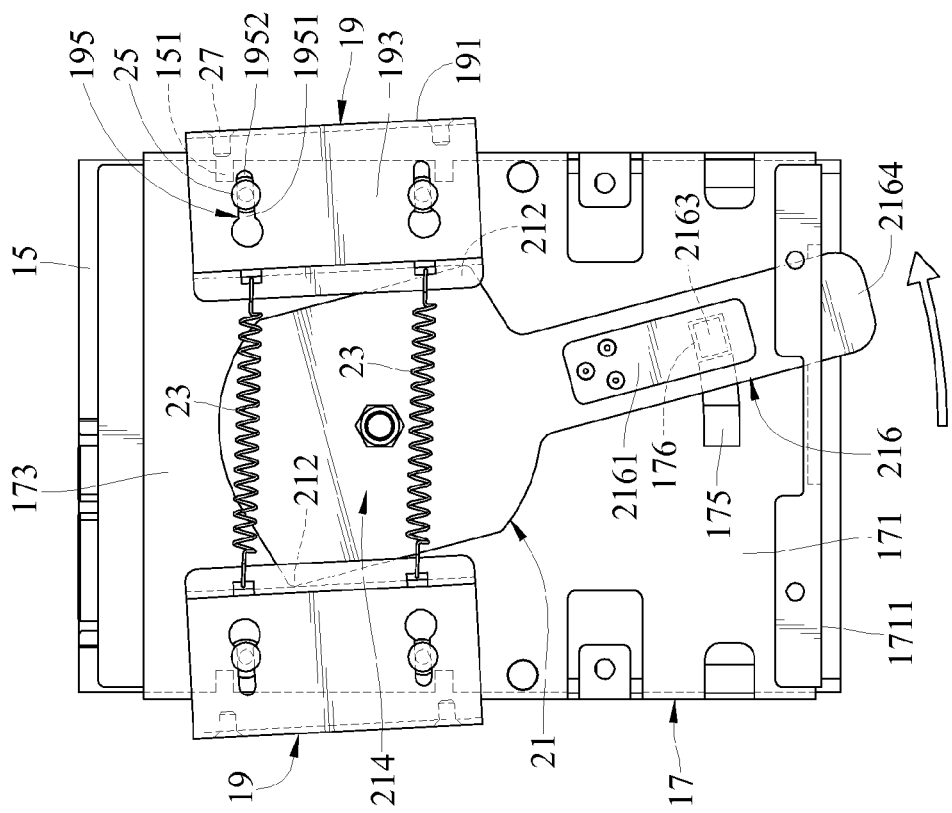
FIG. 5 is a bottom view of a carrying structure and a storage device when the handle is at the first position according to an embodiment of the disclosure.
Figure 4:
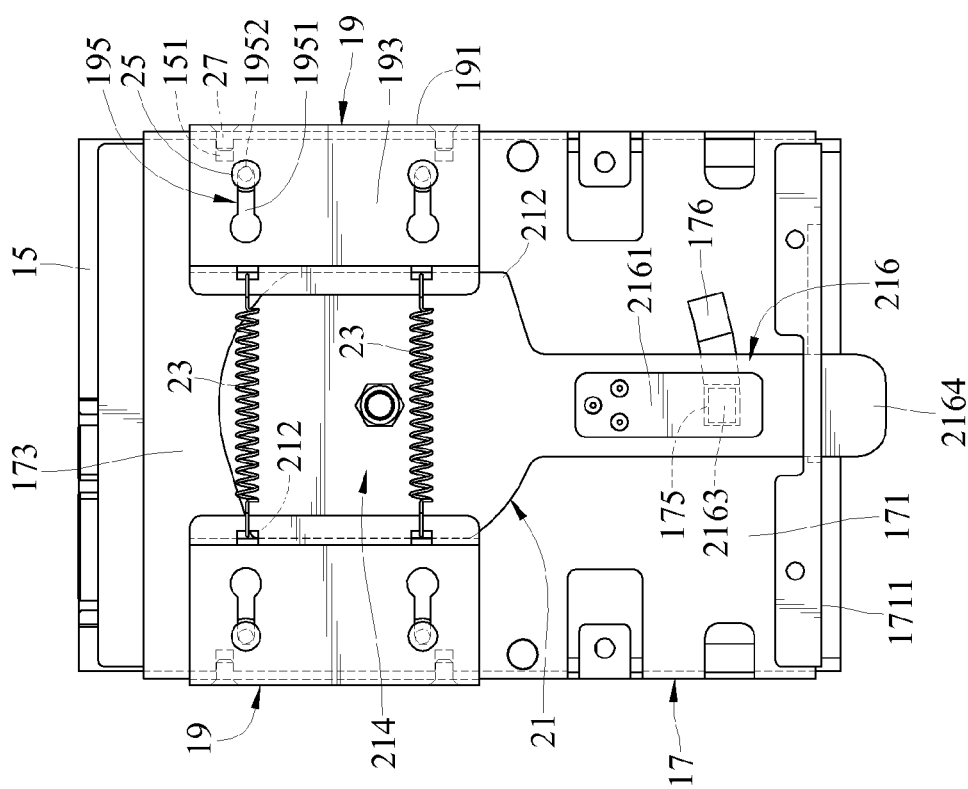
FIG. 4 is a bottom view of a carrying structure and a storage device when the handle is at the second position according to an embodiment of the disclosure.

Next, the assembly and disassembly regarding the storage device 15 and the carrying structure 16 will be set forth. Referring to FIG. 4 and FIG. 5, FIG. 4 is a bottom view of a carrying structure and a storage device when the handle is at the second position according to an embodiment of the disclosure; and FIG. 5 is a bottom view of a carrying structure and a storage device when the handle is at the first position according to an embodiment of the disclosure.

The handle 21 is configured for pivoting relative to the carrier 17 and therefore has a first position and a second position. When the handle 21 pivots from the second position to the first position, the two pushing sides 212 pushes the two pushing sections 193 respectively, so that the two fastening sections 191 are driven to be away from the two fastening portions 151 of the storage device 15. When the handle 21 pivots from the first position to the second position, the two fastening sections 191 close up to each other and are fastened with the two fastening portions 151 of the storage device 15. Specifically, when the handle 21 is at the second position, the protruding stick 25 is at the second section 1952, and the fastening stick 27 penetrates the corresponding through hole 1771 and is fastened with the corresponding fastening portion 151. When the handle 21 is at the first position, the protruding stick 25 is at the first section 1951, and the fastening stick 27 is separated from the fastening portion 151. During the process that the handle 21 pivots from the second position to the first position, its pushing sides 212 pushes the corresponding pushing section 193 of the fastening member 19, so as to make the two fastening members 19 move away from each other. Thereby, the fastening relationship between the fastening stick 27 and the corresponding fastening portion 151 is released, so that the storage device 15 can be removed. During the process that the handle 21 pivots from the first position to the second position, the fastening stick 27 is fastened with the corresponding fastening portion 151, so that the storage device 15 is fixed to the carrying structure 16 steady. The elastic member 23 is stretched when the handle 21 is at the first position and when the handle 21 is at the second position. The extent of the tension of the elastic member 23 when the handle 21 is at the first position is greater than the extent of the tension of the elastic member 23 when the handle 21 is at the second position.

Also noteworthy is that, in an embodiment, the two fastening members 19 clamp the two lateral plates 177, so as to make the two lateral plates 177 clamp the storage device 15. Thereby, the storage device 15 is fixed to the carrying structure 16 steady.

The handle 21 of this embodiment can pivot relative to the carrier 17 and can push the two pushing sections 193 of the two fastening members 19, so that the fastening stick 27 is fastened with or is separated from the corresponding fastening portion 151 of the storage device 15. Thus, users only need to turn the handle 21 to assemble or disassemble the storage device 15. This process is easy to operate and fast, which saves assembly and disassembly time.

Additionally, in this embodiment, the handle 21 can be positioned at the first position and the second position. Specifically, when the handle 21 is at the first position, the locating block 2163 protrudes from the accommodating hole 2162 and is fastened with the first locating hole 176, and when the handle 21 is at the second position, the locating block 2163 protrudes from the accommodating hole 2162 and is fastened with the second locating hole 175. That is, the locating block 2163 is configured for protruding from the accommodating hole 2162 and being fastened with one of the two locating holes 175, 176, so that the handle 21 is positioned at the first position. Besides, the locating block 2163 is configured for protruding from the accommodating hole 2162 and being fastened with the other one of the two locating holes 175, 176, so that the handle 21 is positioned at the second position.

In the server and the carrying structure inside the sever according to the above-mentioned embodiments, since the user only needs to turn the handle to make the pushing sides pushes the pushing sections respectively, so as to make the fastening sticks be fastened with the fastening portions of the storage device, or to release their fastening relationship. This process is fast and easy to operate, and it does not require plenty of locking members which result in complicated assembly and disassembly processes. Thereby, the problem that users feel inconvenient about the assembly and disassembly regarding the carrying structure and the storage device is solved.

What is claimed is:

1. A server comprising:
   a motherboard module comprising a motherboard and a CPU disposed on the motherboard;
   a storage device having two fastening portions opposite to each other; and
   a carrying structure comprising:
      a carrier, wherein the storage device is disposed on the carrier in a detachable manner;
      two fastening members, each comprising a fastening section and a pushing section connected to each other, each of the two pushing sections is disposed at the carrier in a slidable way, and the storage device is located between the two fastening sections; and
      a handle comprising two pushing sides corresponding to the two pushing sections, wherein the handle is pivotally disposed at the carrier, the two pushing sides are located between the two pushing sections, the handle is configured for pivoting relative to the carrier, when the handle pivots from a second position to a first position, the two pushing sides pushes the two pushing sections respectively and drive the two fastening sections to be detached from the two fastening portions of the storage device, and when the handle pivots from the first position to the second position, the two fastening sections close up to each other to fasten with the two fastening portions of the storage device respectively.

2. The server according to claim 1, wherein the carrier further comprises a bottom plate, the bottom plate has a carrying surface and a bottom surface opposite to each other, the storage device is disposed on the carrying surface in a detachable manner, the bottom plate is between the storage device and the handle, the two pushing sections are disposed on the bottom surface in a slidable way, and the bottom plate locates between the two fastening sections.

3. The server according to claim 2, wherein the carrying structure further comprises at least one elastic member, the opposite ends of the elastic member are connected to the two fastening members respectively, the elastic member is stretched when the handle is at the first position and when the handle is at the second position, and the extent of the tension of the elastic member when the handle is at the first position is greater than the extent of the tension of the elastic member when the handle is in the second position.

4. The server according to claim 2, wherein the bottom plate further has two locating holes; the handle further comprises a pivoting portion and an extending portion; the two pushing sides are located at two opposite lateral sides of the pivoting portion; the extending portion has a hand grip connected to the pivoting portion and a elastic piece disposed at the hand grip; the hand grip is located between the elastic piece and the bottom plate; the elastic piece has a locating block; the hand grip has an accommodating hole at a place corresponding to the locating block; when the handle is at the first position, the locating block protrudes from the accommodating hole into one of the two fastening holes to fix the handle to the first position, and when the handle is at the second position, the locating block protrudes from the accommodating hole into the other one of the two fastening holes to fix the handle to the second position.

5. The server according to claim 4, wherein the bottom plate further has a first edge, a part of the hand grip protrudes beyond the first edge, the distance between one of the two pushing sides and the first edge is different from the distance between the other of the two pushing sides and the first edge.

6. The server according to claim 2, wherein the bottom plate disposes two protruding sticks located on the bottom surface, the pushing sections each have a sliding groove, the sliding groove has a first section near the handle and a second section away from the handle, each of the two protruding sticks penetrates the corresponding sliding groove, when the handle is at the first position, the protruding stick is at the first section, and when the handle is at the second position, the protruding stick is at the second section.

7. The server according to claim 2, wherein each of the two fastening sections disposes a fastening stick, the carrier further comprises two lateral plates opposite to each other, each of the two lateral plates has a through hole corresponding to the fastening stick, when the handle is at the first position, the fastening stick penetrates the through hole and is fastened with the fastening portion corresponding thereto, and when the handle is at the second position, the fastening stick is separated from the fastening portion corresponding thereto.

8. The server according to claim 1, wherein the motherboard module further comprises a carrying tray and a rack, the rack is fixed to the carrying tray, the rack has a platform, the motherboard is disposed on the carrying tray and is located between the carrying tray and the platform, the carrier is installed and fixed to one side of the platform back to the mother board, and the handle is between the platform and the carrier.

9. A carrying structure for carrying a storage device, the carrying structure comprising:
   a carrier, wherein the storage device is disposed on the carrier in a detachable manner;
   two fastening members, each comprising a fastening section and a pushing section connected to each other, each of the two fastening sections is disposed at the carrier in a slidable way, and the storage device is locating between the two fastening sections; and a handle comprising two pushing sides corresponding to the two pushing sections, wherein the handle is pivotally disposed on the carrier, the two pushing sides are located between the two pushing sections, the handle is configured for pivoting relative to the carrier, when the handle pivots from a second position to a first position, the two pushing sides pushes the two pushing sections respectively and drive the two fastening sections to be detached from the two fastening portions of the storage device, and when the handle pivots from the first position to the second position, the two fastening sections close up to each other and are fastened with the two fastening portions of the storage device respectively.

10. The carrying structure according to claim 9, wherein the carrier further comprises a bottom plate, the bottom plate has a carrying surface and a bottom surface opposite to each other, the storage device is disposed on the carrying surface in a detachable manner, the handle is pivotally disposed on the bottom surface, the two pushing sections are disposed on the bottom surface in a slidable way, and the bottom plate locates between the two fastening sections.

11. The server according to claim 10, wherein the carrying structure further comprises at least one elastic member, the opposite ends of the elastic member are connected to the two fastening members respectively, the elastic member is stretched when the handle is at the first position and when the handle is at the second position, and the extent of the tension of the elastic member when the handle is at the first position is greater than the extent of the tension of the elastic member when the handle is in the second position.

12. The server according to claim 10, wherein the bottom plate further has two locating holes, the handle further comprises a pivoting portion and an extending portion, the two pushing sides are located at two opposite lateral sides of the pivoting portion, the extending portion has a hand grip connected to the pivoting portion and a elastic piece disposed at the hand grip, the hand grip is located between the elastic piece and the bottom plate, the elastic piece has a locating block, the hand grip has an accommodating hole at a place corresponding to the locating block, when the handle is at the first position, the locating block protrudes from the accommodating hole into one of the two fastening holes to fix the handle to the first position, and when the handle is at the second position, the locating block protrudes from the accommodating hole into the other one of the two fastening holes to fix the handle to the second position.

13. The server according to claim 12, wherein the bottom plate further has a first edge, a part of the hand grip protrudes beyond the first edge, the distance between one of the two pushing sides and the first edge is different from the distance between the other of the two pushing sides and the first edge.

14. The server according to claim 10, wherein the bottom plate disposes two protruding sticks located on the bottom surface, the pushing sections each has a sliding groove, the sliding groove has a first section near the handle and a second section away from the handle, each of the two protruding sticks penetrates the corresponding sliding groove, when the handle is at the first position, the protruding stick is at the first section, and when the handle is at the second position, the protruding stick is at the second section.

15. The server according to claim 10, wherein each of the two fastening sections disposes a fastening stick, the carrier further comprises two lateral plates opposite to each other, each of the two lateral plates has a through hole corresponding to the fastening stick, when the handle is at the first position, the fastening stick penetrates the through hole and is fastened with the fastening portion corresponding thereto, and when the handle is at the second position, the fastening stick is separated from the fastening portion corresponding thereto.

* * * * *